United States Patent [19]

Hara et al.

[11] 4,063,269

[45] Dec. 13, 1977

[54] SEMICONDUCTOR PHOTOELECTRON EMISSION DEVICE

[75] Inventors: Katsuo Hara; Minoru Hagino; Tokuzo Sukegawa, all of Hamamatsu, Japan

[73] Assignee: Hamamatsu Terebi Kabushiki Kaisha, Hamamatsu, Japan

[21] Appl. No.: 735,332

[22] Filed: Oct. 26, 1976

Related U.S. Application Data

[62] Division of Ser. No. 647,761, Jan. 9, 1976, which is a division of Ser. No. 455,231, March 27, 1974, Pat. No. 3,953,880.

[51] Int. Cl.[2] .................... H01L 27/14; H01L 29/161

[52] U.S. Cl. ........................................ 357/30; 357/16; 357/17; 357/52; 357/61

[58] Field of Search ........................ 357/30, 16, 17, 52, 357/61

[56] References Cited

U.S. PATENT DOCUMENTS

| | | | |
|---|---|---|---|
| 3,696,262 | 10/1972 | Antypass | 313/94 |
| 3,814,996 | 6/1974 | Enstrom | 357/30 |

*Primary Examiner*—Martin H. Edlow

*Attorney, Agent, or Firm*—Moonray Kojima

[57] ABSTRACT

Semiconductor photoelectron emission device comprising mixed crystals of two or more different semiconductors forming a heterojunction with direct transition type defining a first region in which may be excited by photoelectrons and an indirect transition type defining a second region whose forbidden band gap is wider than that of the first region and the surface of which is a photoelectron emission surface.

5 Claims, 17 Drawing Figures

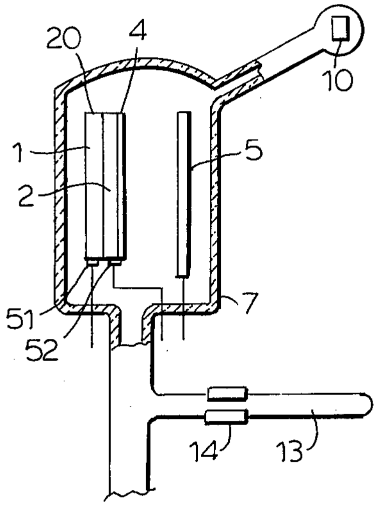
FIG.5
FIG.6A
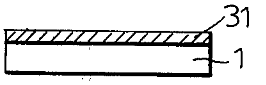
FIG.6B
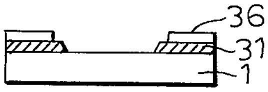
FIG.6C
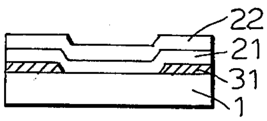
FIG.6D
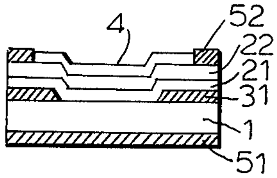
FIG.7A
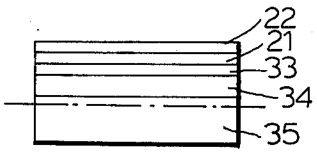
FIG.7B
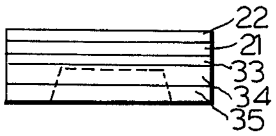
FIG.7C
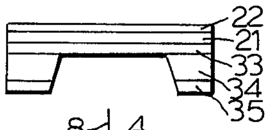
FIG.7D
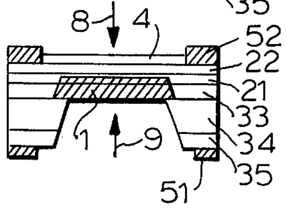
FIG.8A
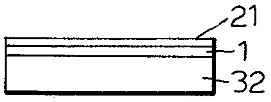
FIG.8B
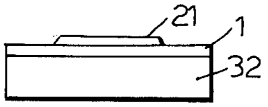
FIG.8C
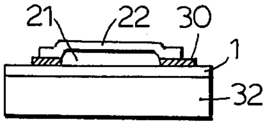
FIG.8D
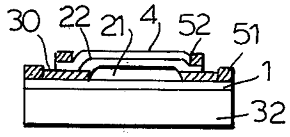

SEMICONDUCTOR PHOTOELECTRON EMISSION DEVICE

This is a division of application Ser. No. 647,761, filed Jan. 9, 1976, which is itself a division of Ser. No. 455,231 filed Mar. 27, 1974, now Pat. No. 3,953,880, issued on Apr. 27, 1976.

BACKGROUND OF THE INVENTION

This invention relates to semiconductor photoelectron emission devices.

It is possible to obtain photoelectron emission by cleaning the surface of a semiconductor and activating with cesium or cesium and oxygen. However, since the pull-out or emission probability of the electrons cannot be made sufficiently high with semiconductors whose forbidden band widths are less than about 1 eV, it has been proposed to form heterojunctions of small forbidden band width semiconductors and large forbidden band width semiconductors and large forbidden band width semiconductors, and to excite the electrons from the former and emit them from the surfaces of the latter into the environment, such as vacuum. However, there may arise a high rate of loss by recombination of the excited electrons in the course of reaching the junction interface and the outer surface, so that this was difficult to carry out in actual practice.

Lattice matching between the different semiconductors has also been previously considered in order that the loss at the junction could be alleviated. For example, the lattice constants of germanium and zinc selenide are in good matching. However, since the two semiconductors will not make a solid solution in a wide range of concentrations, grain boundaries appear at the junction and form a large obstacle to injections of minority carriers. Further, since the zinc selenide is a direct transistion type semiconductor, injected electrons arc lost by recombination in the course of passing through this region. Consequently the region has to be made extremely thin, but this is quite difficult to obtain technically.

SUMMARY OF THE INVENTION

The present invention removes the forgoing and other defects and disadvantages of the prior art and encompasses a device capable of emitting photoelectrons with high efficiency. The photoelectron device comprises a heterojunction formed with mixed crystals of two or more semiconductors including a first region of a direct transition type semiconductor of small forbidden band width and a second region of an indirect transition type semiconductor with a comparatively wider forbidden band width. Means excite the photoelectrons in the former and emit them from the surface of the latter into the exterior, such as a vacuum.

It is required that there be a homogeneous solid solution. In order to inject the excited electrons from the direct transition type semiconductor of the first region to the indirect transition type of the second region, an electric field may be applied between them. Also, the emission efficiency is markedly raised by activating the surface of the second region with cesium or cesium and oxygen. It is further desirable that the semiconductors comprising the heterojunction have the same type of crystal structure and that their crystal orientations be identical or substantially similar and that the differences in their lattice constants be as small as possible.

Since the present invention can, in this manner, form a heterojunction by using semiconductors that will mutually go into solid solution in any desired proportions and by matching their lattice constants, defects at the junction may be substantially reduced to be very few and the electron injection loss be reduced to be very small. Also, since the photoelectrons are excited in the direct transition type first region, the transition probability is high, and it is possible to raise the number of photoelectrons generated per unit of incident light. In addition, by making at least the greater portion of the region in which the electrons are injected of an indirect transition type semiconductor, it is possible to have only an extremely small amount of electrons lost by recombination during their passage to the emission surface. That is, since the electron transport factor is extremely high and the forbidden band of the region having the emission surface is widened, it is possible to attain high electron emission efficiency by activation treatment.

A feature of the invention is the use in a photoelectron emission device of mixed crystals of two or more semiconductors to form a heterojunction. In such a device another feature is the crystals defining a first region of direct transition type semiconductor and a second region of an indirect transition type semiconductor having a forbidden band wider than that of the first region.

Advantageously, the mixed crystals being mutually soluble in solid solution enable substantial matching of crystal structures and lattice constants. Electron injection loss is substantially reduced. The use of direct transition type first region and indirect transition type second region with wider forbidden band gap enables high probability of electron transition and increase of photoelectrons generated per unit of incident light, and furthermore, only a small amount of electrons are lost by recombination.

A further feature of the invention is the use of mixed crystals selected from the group consisting of GaSb, AlSb, InSb, InAs, AlAs; and impurities of Zn, Cd, Te, Si, Ge, and Sn; and any combination thereof; and use of atoms of Groups III and V to control the lattice parameters.

Another feature of the invention is the use of an intermediate layer of intrinsic semiconductor or n-type semiconductor between the first region and the second region.

Advantageously, the second region can have a thickness equal to or less than the diffusion length of the electrons.

A further feature of the invention is the physical arrangement of the different materials alone or in combina- with other types of materials, such as an insulating or high resistance material.

The foregoing and other features, objects and advantages of the invention will become clearer with the reading of the below drawing and detailed description, both of which are to be construed to be illustrative of the invention and not in any limiting sense.

BRIEF DESCRIPTION OF DRAWING

FIG. 5 depicts a vessel in which surface activation is carried out;

FIGS. 6A, 6B, 6C, and 6D depict an illustrative embodiment of one arrangement of layers to form the invention device;

FIGS. 7A, 7B, 7C and 7D depict another illustrative embodiment of another arrangement of layers to form the invention device; and FIGS. 8A, 8B, 8C and 8D depict a further embodiment of a further arrangement of the layers of the invention device.

DETAILED DESCRIPTION OF PREFERRED EMBODIMENTS

Figure 1:
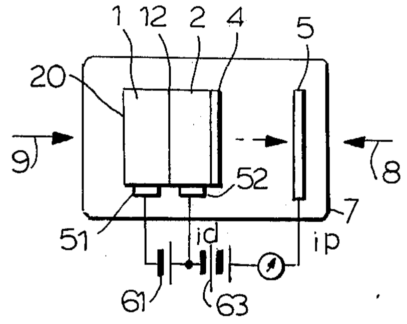
FIG. 1 depicts an illustrative embodiment of the invention with two regions.

FIG. 1 depicts an arrangement of an illustrative embodiment of the invention, wherein heterojunction 12 is formed in crystal 20 by first region 1 comprising p-type conductivity direct transition type semiconductor whose effective forbidden band gap is comparatively narrow and by second region 2 comprising a p-type conductivity indirect transition type semiconductor whose forbidden band gap is wider than that of the first region. This crystal 20 may be enclosed in high vacuum vessel 7. After surface 4 of second region 2 is cleaned it is given zero or negative electron affinity by activating with cesium or cesium and oxygen. Anode 5 may be installed in the vessel 7 facing this surface 4. In the first and second regions, ohmic contacts or electrodes 51 and 52 may be furnished, which apply a suitable bias voltage between the regions by means of power source 61, together with application of suitable positive voltage to anode 5 by means of power source 63. When light rays 8 or 9 of photon energies greater than the forbidden band gap of this portion are made to be incident on first region 1, the photoelectrons are excited toward the conduction band.

These electrons are passed through heterojunction 12 by action of the electric field generated by power source 61 and are injected into the conduction band of second region 2 and emitted from surface 4 into vacuum and collected by anode 5. Consequently, there is a flow of photoelectron current *ip*. In this case, te electric field has the offset of raising the response speed and increasing the transport factor of electrons excited by the light rays 9. In order to obtain such a drift electric field, a slope may also be given to the impurity concentration, or it is also possible to give the slope to the composition of the mixed crystal. Also, in second region 2, there must be strong prevention of loss of the injected electrons by recombination. Because of this the present invention is one that uses indirect transition type semiconductors. It is further desirable that the thickness of second region 2 be equivalent to or less than the diffusion length of the electrons. It is also advantageous to form a drift electric field by such means as providing a slope in the impurity concentration or a slope in the composition of the crystal.

Figure 2:
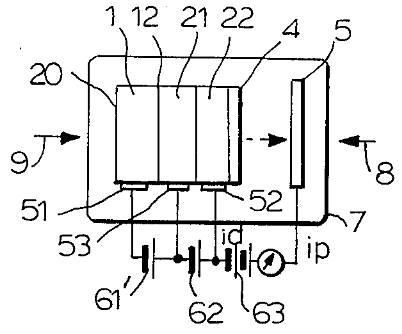
FIG. 2 depicts another illustrative embodiment of the invention with three regions.

The device of FIG. 1 consumes electric power with diode current $i_d$ flowing to heterojunction 12. FIG. 2 depicts an embodiment wherein this power is decreased and the injection rate is increased. The embodiment comprises a intermediate transition type second region 22 whose forbidden band is over 1 eV and which has p-type impurities doped thereto and a first region 1 as described above. Between these two regions is interposed region 21 of an intrinsic semiconductor whose forbidden band is wider than that of the second region. The region 21 may be a semiconductor having a low impurity concentration close thereto. Consequently, a barrier is formed to the holes injected from second region 22 to region 21, Because of this, the injection of the holes is blocked and the diode current $i_d$ is decreased, and the injection rate of the electrons is increased. IN addition, ohmic contact electrode 53 is furnished in region 21 and bias power 61' and 62 are interposed between electrodes 51 and 52. However, it is possible to eliminate this electrode 53. Also, when region 21 is made of an indirect transition type semiconductor, the recombination loss during passage of the injected electrons through this region is alleviated. Consequently, while it is possible to increase its thickness and its manufacture is made more easily, the acceleration of the electrons is made still more effective when a slope is imparted to the mixed crystal compostion or a slope is made in the impurities concentration, in at least one of the several regions.

Figure 3:
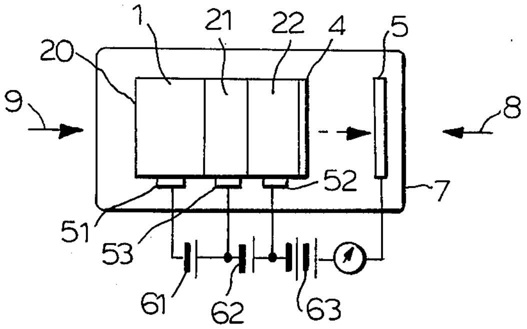
FIG. 3 depicts a still further illustrative embodiment of the invention with three regions, similar to FIG. 2, except for the use of a different material in the intermediate layer.

FIG. 3 depicts an embodiment similar to FIG. 2 except region 21 is an n-type semiconductor region 21'. In this case, there is extended a depletion layer by applying a reverse bias with power source 61' on the heterojunction between the first region 1 and region 21'. Consequently, the photoelectrons that are particularly excited in the depletion layer of first region 1 are accelerated by the high electric field of the depletion layer and injected into region 21' with good efficiency, and are further transported to region 22 by electric field generated by power source 62.

Various semiconductor materials may be used in the present invention. Mixtures of gallium antimonide (GaSb); and aluminum antimonide (AlSb) are preferred. Both of these crystal structures are zinc blend structures, being considerably alike with the former having a lattice constant of 6.0954 Angstroms and the latter of 6.1355 Angstroms. They will also go into solid solution in any desired proportion of composition, and the former is a direct transition type and the latter is an indirect transition type.

Figure 4:
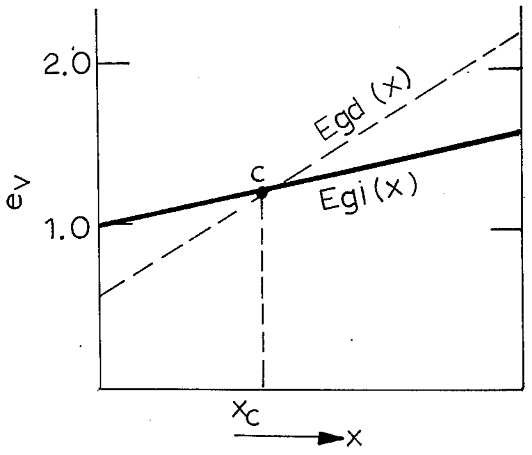
FIG. 4 depicts the relation between the forbidden band gap and composition of a specific example of the invention.

FIG. 4 is a chart showing the relation between the forbidden band width at 300° K and composition $x$ of a crystal mixture of GaSb and AlSb, namely, Al($x$)Ga(1-$x$)Sb, wherein $x$ is a positive number less than 1, and wherein the indirect transition forbidden band width Egi($x$) in the former is about 1 eV, while that of the latter is 1.62 eV. Also, the direct transition forbidden band width Egd(x) is 0.7 eV for GaSb and 2.218 eV for AlSb, and the transition type of the mixed crystal is determined by the smaller value of the curves Egi($x$) and Egd($x$). That is, when the composition at the intersection of the curves at $c$ is taken as $x_c$, composition $x$ is a direct transition type in the range smaller than this, and is an indirect transition type in the range larger than this, so that this relation will give the transition type and the forbidden band width. Consequently, the first region 1 is taken as having composition $x$ lower than $x_c$, and the second region 2 as having higher than $x_c$, and the forbidden band gap of the former is selected at between 0.7 to 1.25 eV and that of the latter at 1.25 to 1.62 eV.

There is also a minute difference in the lattice constants of GaSb and AlSb as before stated. However, it is possible to get much better matching of these crystals by substituting portions of the lattice points or sites by using other atoms of Groups III or V for those occupied by atoms of Groups III or V, or by using substitute other atoms. For example, when a portion of the Ga lattice sites in GaSb is substituted by indium (In) having a larger covalent ion radius, the lattice constant is increased to be close to that of AlSb. Also, when a portion of the Sb is substituted with bismuth (Bi), the same effect is obtained. When a portion of the Sb lattice sites in AlSb are substituted with such as arsenic (As) and phosphorus (P) which have small covalent ion radii, the lattice constant decreases and approaches that of GaSb. It is further possible to substitute with impurities such as Zn, Cd, Te, Si, Ge and Sn that determine the conductivity type of the semiconductor and thus control the matching of the lattice constants while simultaneously controlling the conductivity type and the resistivity.

It is further possible to vary the effective forbidden band width by the substitutions described above. Since the width of the forbidden band of the first region which the photoelectrons excited determines the response threshold of the long wave length, it is very important that this is made small. Consequently, when the first region is GaSb, the threshold of the long wavelength will be about 1.8 microns, but the response wavelength will be extended by making this zone a mixed crystal of GaSb and InSb or InAs. On the other hand, when there is a need to increase the forbidden band width of the second region, part of the Sb can be substituted with As or P.

Although the foregoing has been an explanation for the case when the device is mainly constructed of GaSb, AlSb and their mixed crystals, it is also possible to use, for example, GaAs, AlAs and their mixed crystals, GaAs being a direct transition type semiconductor whose effective forbidden band width is 1.43 eV and whose lattice constant is 5.642 Angstoms and AlAs being an indirect transition type semiconductor whose effective forbidden band width is 2.13 eV and whose lattice constant is 5.661 Angstoms. These can be made into solid solutions in any proportions and so comprise types of materials suitable for obtaining the device of this invention.

In a preferred embodiment of this invention, as shown, for example, in FIG. 1, the inventive device was manufactured with GaSb as first region 1 and AlSb as the second region 2. First, a p-type GaSb monocrystal was given a mirror finish by mechanical means, and the damaged layer was removed by etching. This crystal was washed and dried, then inserted in a vapor phase growing apparatus, and Al($x$)Ga(1-$x$)Sb was grown to form second region 2. In this case i was difficult that the GaSb first region was made thin. However, a transmission type photoemission device is obtained as follows. First, Al(x)Ga(1-$x$)Sb, wherein ($x$) is greater than $x_c$, secondly GaSb are successively grown on AlSb monocrystal substrate, for example, using a slide method of liquid phase epitaxial growth, Andthen the AlSb substrate is easily removed from the other protions because of its high etching speed. In this device GaSb is the first region and Al($x$)Ga($1-x$)Sb is the second region. It is also possible to obtain a reflection type photoemission device by growing AlSb or Al($x$)Ga($1-x$)Sb, wherein $x$ is greater than $x_c$, on a GaSb subtrate.

Crystal 20 obtained in the aforestated manner is formed in the desired shape and electrodes 51 and 52 may be attached by such means as metal deposition. The device may be inserted into a vacuum vessel 7, as shown in FIG. 5.

This vessel 7 is furnished with a branch tube with cesium generating source 10 contained therein, and sliver tube 13 which is connected with a gas exhaust tube via cover seal 14. When this vessel 7 is connected to an oil free very high vacuum exhaust system and evacuated to a pressure degree of at least $10^{-7}$ Torr, vessel 7 may be heated to 350° C to degas. When a pressure degree of about $10^{-8}$ Torr is reached, the heating is stopped. Then cesium source 10 is heated. The cesium is liberated inside the branch tube, and is cooled by dry ice or liquid nitrogen to condense it inside the branch tube.

The electron emission surface of crystal 20 is purified by heating for a number of minutes at about 500° C in a very high vacuum or by argon ion bombardment. After this cleaning treatment is performed, the electron emission surface is irradiated with white light, and either a number of tens of volts is applied between electrode 52 and cathode 5 while observing the photoelectric current; or else voltage is applied between electrodes 51 and 52 without any irradiation of light rays while observing the cold electron emission.

In this state the cooling of the branch tube is stopped, the cesium is gradulaly fed into vessel 7, and when the maximum photoelectric current or cold electron flow has been achieved, the cesium feeding is stopped, and oxygen in air is introduced into vessel 7 by heating tube 13. This introduction of oxygen is done with care so that the partial pressure does not exceed $10^{-7}$ Torr. Thus, the current after temporary rising, will decrease. When the current has declined to about one tenth, it is increased by again introducing cesium. When these operations are repeated and a maximum current is observed, the surface 4 is achieved. The branch tube is sealed off, vessel 7 is sealed off from the vacuum system and the device is completed. It is possible to use a cesium ion gun in introducing the cesium and, in this case, it is also possible to perform quantification of the inlet amount.

Since it is particularly important that there be little dark current in a photoelectron emission device, it is necessary to prevent thermal excitation of the electrons. In order to do this, it is necessary that the Fermi level in the semiconductor of the first region be as close as possible to the valence band. Consequently, it is useful that the concentration of the p-type impurities be as high as possible considering the diffusion length, although if it is over $10^{17}$ atom/cm$^3$, it will be sufficient. However, it is possible, such as in the embodiment of FIG. 3, to have a low concentration of impurities in the portion adjoining the depletion layer of the first region. That is, the impurity concentration is selected so that a suitable thickness of a depletion layer extends toward the first region. For example, the layer can be intrinsic one.

It is necessary to consider the structure of the device further in order to lower the dark current and raise the photoelectric sensitivity. FIG. 6A–D, is an embodiment to effect such results. As shown in FIG. 6A, an n-type GaSb layer 31 of about 10 μm in thickness is epitaxially grown on p-type GaSb substrate having impurity concentration of about $10^{17}$ to $10^{19}$ atom/cm$^3$. Substrate 1 forms the first region, its thickness is for example about 100 μm, and the surface has a suitable orientation such as (111), (100), or (110), and the impurity concentration of n-type layer 31 is about $10^{16}$ to $10^{17}$ atom/cm$^3$.

Next, as shown in FIG. 6B, a suitable mask 36, such as a synthetic resin film or photoresist is formed on growth layer 31 and a portion of growth layer 31 is removed by etching. Mask 36 is removed, and as shown in FIG. 6C, Al(1-$x$)Ga($x$)Sb layer 21 with a wide forbidden band gap, and a low impurity concentration to form a barier against the holes, and p-type Al(1-$x$)Ga($x$)Sb layer 22 with a narrower forbidden band gap are grown. In these formulae, the $x$ is a positive number less than 1. Layer 21 should suitably be about 500 Angstroms to 10 $\mu$m, of an order that the holes will not tunnel through from region 22 to region 21. It is also necessary that the thickness of layer 22 be less than the diffusion length of the injected electrons.

Finally, as shown in FIG. 6D, ohmic contact electrodes 51 and 52 are attached and surface layer 4 is formed by cesium or cesium and oxygen in a very high vacuum vessel. That is, region 31 is n-type and region 1 is p-type, so that a depletion layer is made at their boundary, and this has the action of an insulating film and restricts the range of of the electron emission. Consequently, the emission of electrons thermally excited in the unnecessary part of the region 1 can be prevented. Furthermore, the region contributes to decrease bias current. Also, the photoelectrons which have been attained or reached the ohmic contacts 52 are lost by recombination and are not emitted. But, since in the device of FIG. 6A–D, the contact of electrode 52 is separated from the electron injection zone of the second region by more than the electron diffusion length, the loss of this can be disregarded.

FIG. 7A–D is an example of a transmission type device, wherein as shown in FIG. 7A, successive epitaxial growth layers are made on p-type GaSb base 35 of high concentration p-type Al($x$)Ga(1-$x$)Sb, wherein $x$ is a positive number smaller than 1, layer 34 and n-type GaSb layer 33, low impurity concentration and wide forbidden band gap Al($x$)Ga(1-$x$)Sb layer 21 and narrower forbidden band gap and high impurity concentration p-type Al($x$)Ga(1-$x$) Sb layer 22. After that, base 35 is lapped off, for example, mechanically, up to the position shown in the Figure by the broken line 71. Still another porton is pared by such as sand blasting as shown by the broken line 72 in FIG. 7B, forming a hole reaching to layer 34.

FIG. 7C shows a state where a prescribed portion of layer 34 has been selectively removed by utilizing the difference in etching speeds between GaSb and the Al($x$)Ga(1-$x$)Sb layer, and then the first region is formed in the portion shown by slanted lines in FIG. 7D close to GaSb layer 33 by diffusing a p-type impurity such as zinc using a mask such as silicon oxide ($SiO_2$) or aluminum oxide ($Al_2O_3$). Then, electrodes 51 and 52 are provided, and evacuating and activation treatment are performed to complete the device.

This device can respond to both light rays 8 and 9, and is made so that the impurity concentration of region 1 is highest on the reverse surface side. Consequently, there is formed a drift electric field such that the photoelectrons formed by region 1 are accelerated in the direction of emission surface 4. There are particularly many electrons that are excited at the reverse surface side of region 1, and recombination in this part is a problem. Since these excited electrons move directly toward the junction interface because of the drift electric field, there is little loss. Such a drift electric field can also be formed by providing a slope in the effective forbidden band. Also, since region 33 is an n-type, a depletion layer is made between it and region 1 and there is the same action as in region 31 of the embodiment of FIG. 6A–D, but there is an even greater effect given by applying a reverse bias as required between regions 33 and 1. Since the forbidden band gap of region 34 is wider than of region 1, the electrons excited in region 1 can be prevented from diffusing into region 34. The GaSb layer of region 35 is useful in lowering the ohmic contact resistance. Regions 33 in FIG. 3 and 31 in FIG. 6 form high resistance, and these parts can be insulation layers of such materials as $SiO_2$ or $Al_2O_3$.

FIG. 8A–D depict the construction of a transmission type device using transparent support base 32, where there may be used such materials as sapphire, corundum, quartz, transparent alumina, and wide forbidden band gap semiconductor crystals such as ZnSe, SnS, SeC, ZnTe, GaP and AlP. The compound ZnTe has the same crystal structure as GaSb, and their lattice constants are close to each other. Then GaSb-ZnTe system is a preferred compound to use.

As shown in FIG. 8A, there are grown on base 32, which may be ZnTe suitable thicknesses of p-type GaSb layer 1 and high resistance and wide forbidden band Al($x$)Ga(1-$x$)Sb layer 21. Then the portion of region 21 in FIG. 8A is etched as in FIG. 8B using a mask, and then as shown in FIG. 8C, there is furnished insulation film or layer 30 of $SiO_2$ or $Al_2O_3$. After this, region 22 of a p-type Al($x$)Ga(1-$x$)Sb layer with a narrower forbidden band gap than region 21 and a high impurity concentration is grown, electrodes 51 and 52 are provided as shown in FIG. 3D, and then the active surface 4 is formed. In this case, since the forbidden band gap of ZnTe is 2.26 eV, base 32 acts as a window for the lower energy photon than this gap.

In transmission type photoelectron emission devices, since the incident light rays at the surface of the first region have maximum strength, recombination is a problem at this part. Since the recombination velocity at the surface of the semiconductor is greater than other parts, an effective means of preventing it is to apply a suitable surface treatment. It is also effective to widen the forbidden band gap of the first region near the illuminated surface to decrease the recombination at the surface, and it is also possible to furnish an antireflecting film to enhance the sensitivity.

The foregoing description is for purposes of illustrating the principles of the invention. Numerous variations and modifications thereof would be apparent to the worker skilled in the art. All such variations and modifications are to be considered to be within the spirit and scope of the invention.

What is claimed is:

1. A semiconductor photoelectron emission device comprising: ohmic contacts;

a first layer of p-type $Al_xGa_{(1-x)}Sb$, wherein $x$ is a positive number less than 1, having high impurity concentration and predetermined forbidden band and being of an indirect transition type semiconductor;

a second layer of $Al_xGa_{(1-x)}Sb$ having a low impurity concentration and wider forbidden band;

a third layer of n-type GaSb, said third layer having at selected portions, different layers of direct transition type semiconductor of p-type impurity thereby to form thereat with said first layer a heterojunction; said third layer and said first layer having substantially the same crystal structures at said junction and having small differences in lattic constants;

a fourth layer at parts of said third layer substantially absent said diffused p-type impurity, said fourth layer comprising high concentration p-type $Al_xGa_{(1-x)}Sb$;

a fifth layer of p-type GaSb on said fourth layer; and electrodes on said fifth layer, whereby said ohmic contacts are disposed on said first layer at selected areas wherein transversely are absent said diffused p-type impurities, and said first layer has an electron emissive surface at areas not covered by said ohmic contacts and thereby to form a transmission type device.

2. The device of claim 1, wherein further comprising means for providing drift electric fields.

3. The device of claim 1, wherein lattice sites of the mixed crystals have atoms thereof replaced with other atoms of In, Bi, As and P.

4. The device of claim 1, wherein said GaSb has an effective forbidden band of 0.7 to 1.25 eV.

5. The device of claim 1, wherein said second layer has a thickness equivalent of less than the electron diffusion length.

* * * * *